United States Patent [19]
Giesl

[11] Patent Number: 4,709,164
[45] Date of Patent: Nov. 24, 1987

[54] CIRCUIT FOR THE CONTINUOUS WATCHING OF THE GROUNDING RESISTANCE OF ELECTRICAL APPLIANCES

[75] Inventor: Johann Giesl, Pfreimd, Fed. Rep. of Germany

[73] Assignee: Elektromanufaktur Zangenstein Hanauer GmbH & Co., Fed. Rep. of Germany

[21] Appl. No.: 849,498

[22] PCT Filed: Aug. 2, 1985

[86] PCT No.: PCT/EP85/00388
  § 371 Date: Mar. 25, 1986
  § 102(e) Date: Mar. 25, 1986

[87] PCT Pub. No.: WO86/01299
  PCT Pub. Date: Feb. 27, 1986

[30] Foreign Application Priority Data
  Aug. 7, 1984 [DE] Fed. Rep. of Germany ....... 3429067

[51] Int. Cl.⁴ .................. H02H 3/16; G08B 21/00
[52] U.S. Cl. ................................ 307/326; 340/650; 361/42; 361/56
[58] Field of Search .............. 307/326; 361/42, 47–50, 361/88, 77; 340/649–652, 660, 661

[56] References Cited

U.S. PATENT DOCUMENTS

| | | | |
|---|---|---|---|
| 3,864,581 | 2/1975 | Satyanarayana | 307/326 |
| 3,878,458 | 4/1975 | Muska | 361/42 |
| 4,298,864 | 11/1981 | Mahnke et al. | 361/56 |
| 4,447,844 | 5/1984 | Schossow et al. | 361/77 |

FOREIGN PATENT DOCUMENTS

| | | |
|---|---|---|
| 2122140 | 5/1971 | Fed. Rep. of Germany . |
| 1545569 | 11/1968 | France . |
| 2460558 | 1/1981 | France . |
| 365442 | 12/1962 | Switzerland . |

*Primary Examiner*—Vit W. Miska
*Attorney, Agent, or Firm*—Woodward, Emhardt, Naughton, Moriarty & McNett

[57] ABSTRACT

A circuit for the continuous watching of the grounding resistor of electrical appliances whose electrically conductive parts which may be touched, such as especially the casing are connected to a ground potential by a protecting conductor, one of the live leads (R,N) of the appliance (12) being connected with the protecting conductor by way of a series connection of at least one precision resistor (R1) for measuring purposes, one test pulse generator (TG), and one capacitor (C$_B$).

21 Claims, 4 Drawing Figures

CIRCUIT FOR THE CONTINUOUS WATCHING OF THE GROUNDING RESISTANCE OF ELECTRICAL APPLIANCES

The invention relates to a circuit for continuously watching the grounding resistor of electrical appliances whose touchable, electrically conductive structural members, such as especially the casing, are connected to a ground potential by a protecting conductor.

As is well known, the metal parts to be touched, like the housing of electrical household appliances are connected to ground so as to protect the user from electric shock. If an electrically conductive part of such an appliance should become hot because of faulty insulation, the user who touches that part still does not get an electric shock because the part is at ground potential.

With the state of the art two fundamentally different types of protective circuits are to be distinguished, namely the so-called "protecting conductor connection" and the so-called "neutralization".

With the protecting conductor connection there is no galvanic connection at or in the electrical appliance between the so-called neutral conductor of the power current network and the local reference ground. Rather, the appliance is furnished with a protecting conductor which connects all dangerous touchable metallic parts with the local reference ground. If a fault occurs in the insulation of the appliance, a fault current which reaches the casing of the appliance is shunted to the reference ground by way of the protecting conductor. If this shunted current reaches a certain threshold value, usually the current supply to the appliance is turned off by means of a fuse.

On the other hand, if the so-called neutralization is provided to protect the user, the neutral conductor of the supply network at the electrical appliance is connected to the local reference ground. The protecting conductor in this case need not be connected separately with the reference ground, instead it is connected to the neutral conductor of the supply network at the socket (or in the terminal box). If an insulation fault occurs in the appliance with this type of protective circuit, the current flowing through the outer metal parts which may be touched is led off through the protecting conductor to the neutral conductor. As soon as this shunted current exceeds a preselected current intensity, the feeding voltage of the appliance is interrupted.

The known protecting circuits do not afford one hundred per cent safety for the user if the connection of the protecting conductor is deficient. The occurrence of line and contact resistances at the terminal or plug connections is unavoidable both with the protecting conductor connection as well as the neutralization described above. Thus series resistance which is not recognized at once may occur between the reference ground and the touchable metal member of the appliance if the contacts are poor. This series resistance between the touchable metal member and the reference ground may have the consequence of a dangerous voltage being developed at the metal part if there is a fault in the insulation of the appliance.

For the sake of protecting operators, therefore, there is considerable interest in continuously watching the grounding resistor (resistance between touchable metal part of the appliance and local reference ground). If this ground resistance exceeds a certain critical value, the voltage supply to the appliance must be interrupted for reasons of safety.

For monitoring the grounding resistance mentioned, it is known to connect the casing of the appliance (or other touchable metal members) to ground potential by a separate additional conductor apart from the conventional connections (main conductor, neutral conductor, and perhaps protecting conductor).

High-ohmic voltage metering is effected between the protecting conductor and the additional lead. The voltage rises in case of an increase of the grounding resistance and an insulation fault, and the respective appliance is switched off. However, this separate lead to the local reference ground is not available in customary installations so that it cannot be used for every appliance.

It is the object of the invention to provide a circuit for watching the grounding resistance of electrical appliances which circuit does not require an additional lead and with which the ground resistance is checked continuously at all times.

This object is met, in accordance with the invention, in that one of the live leads of the appliance is connected to the protecting conductor by a series connection comprising at least one precision resistor for measuring purposes, a test pulse generator, and a capacitor.

In a preferred modification of the invention the test pulse generator delivers pulses of constant voltage amplitude. The duration of the pulses generated by the test pulse generator, the precision resistor, and the capacitance of the capacitor are so dimensioned that the time constant of the RC member composed of the precision resistor and the capacitor is much greater than the rise time of the pluses. Thus the capacitor presents a very low ohmic connection for the pulses as compared to the other circuit elements. Thus if the grounding resistance (in other words the ohmic resistance between the metallic casing and the reference ground) equals zero, the full voltage amplitude of the pulses generated by the test pulse generator drops at the precision resistor.

On the other hand, if the ground resistance differs from "zero" in case of a disturbance, a certain voltage drops both across the precision resistance as well as the grounding resistor. The overall voltage of the test pulse thus is divided into two partial quantities between which the ratio is the same as between the quantities of the resistances (precision resistor and grounding resistance) and the sum of which corresponds to the amplitude of the test pulse.

Thus if the voltage drop across the precision resistor is measured by a voltmeter and compared with a preselectable comparative voltage, a conclusion may be drawn as to the grounding resistance from a reduction of the voltage drop across the precision resistor. If the voltage drop at the precision resistor decreases below a given value, a fact which indicates a rise of the ground resistance above a certain limit value, the voltage supply of the appliance may be interrupted automatically and/or a warning means may be released.

The capacitor is designed in accordance with safety regulations so as to afford protection against electric shock upon touching in order to warrant that the protective circuit itself does not feed the touchable casing with a dangerous voltage even if the protective grounding should be interrupted, in other words at great or even infinitely great ground resistance. In this manner the shunted current caused by the mains voltage itself (50 or 60 Hz) with the superimposed current of the test pulse generator remains smaller than the limit value which is permissible for the human body. To this end, also the voltage amplitude generated by the test pulse generator is kept below the threshold voltage which is dangerous for the human body.

In a preferred and particularly simple modification of the invention the test pulse generator is embodied by a trigger diode, such as a diac or four-layer diode.

Moreover, the test pulse generator may be a transistor circuit which is so designed that great resistance is given if an external voltage below a certain threshold value is applied, whereas the resistance of the two-pole transistor circuit breaks down if the voltage is above the threshold value.

The invention will be described further below with reference to the drawing, in which.

Figure 1:
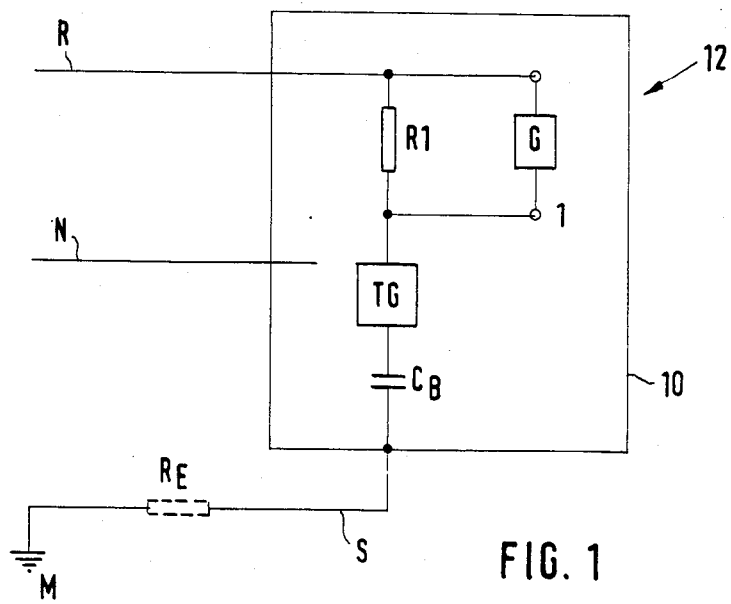
FIG. 1 shows a circuit according to the invention.

In FIG. 1 the electrical appliance equipped with the protective circuit according to the invention is marked by reference numeral 12. The casing 10 of the electrical appliance 12 is to represent all electrically conductive structural members which a user may touch. The electrical appliance 12 is connected to the supply mains by a main conductor R and a neutral conductor N. Furthermore, a protecting conductor S is provided which connects the casing 10 to the local reference ground M. The grounding resistance, in other words the resistance between the casing 10 and the local reference ground M is designated $R_E$. If the circuit connection meets the regulations, the grounding resistance $R_E$ practically equals zero.

A precision resistor R1 for measuring purposes, a test pulse generator TG, and a capacitor $C_B$ are connected in series between the main conductor (phase) R and the casing 10.

The test pulse generator TG delivers pulses of constant voltage amplitude. The pulse duration is so dimensioned that the time constant of the precision resistor R1 and the capacitor $C_B$ is distinctly greater than the pulse rise time. The capacitor $C_B$ thus presents a very low ohmic connection for the test pulses as compared to the other circuit components. If it is assumed that the grounding resistance $R_E$ has a value of zero ohm, then the full amplitude $U_T$ of the pulses of the test pulse generator TG drops at precision resistor R1. On the other hand, if the grounding resistance $R_E$ does not equal zero but instead adopts an infinite value, then the voltage amplitude $U_T$ of the test pulse generator TG drops at the precision resistor R1 as well as at the grounding resistance $R_E$ at the ratio of the transistors. In that event the following relationships apply:

$$U_E + U_1 = \text{constant}$$

$$U_E + U_1 = R_T$$

wherein $U_E$ and $U_1$ are the voltage drops across the grounding resistance $R_E$ and the precision resistor R1, respectively.

Thus if the grounding resistance $R_E$ rises, while the amplitude of the pulses of the test pulse generator TG remains the same, the voltage drop $U_1$ across the precision resistor will diminish. Consequently any undesired rising of the grounding resistance $R_E$ above a certain limit value can be determined directly from the reduction in the voltage drop $U_1$ across the precision resistor R1. The reduction in voltage drop $U_1$ is measured by a voltmeter G and compared with a preselected value thereat. As soon as the voltage drop $U_1$ falls below a predetermined value, the voltage supply of the electrical appliance 12 or of a certain part thereof is interrupted and/or a warning means is released.

The capacitor $C_B$ is designed in accordance with safety regulations so as to afford protection against electric shock upon touching. This is intended to guarantee that no dangerous voltage will be applied by the circuit to the casing 10 in case of an interruption of the protective grounding, in other words at a great or even infinitely great value of the grounding resistance $R_E$. Consequently, upon touching, the current led off which is generated by the mains voltage R, N (50 or 60 Hz) as well as the superimposed mean value of the pulse current generated by the test pulse generator TG remain smaller than the limit value corresponding to the safety regulations. Also the test pulse generator TG is so designed that the amplitude of the voltage it delivers will remain below an undangerous admissible low tension.

To this end the test pulse generator TG is embodied by a trigger diode, for example a diac. The diac remains high ohmic until the voltage applied to both its terminals reaches a certain limit value. When the limit voltage has been exceeded, the diac switches over into a low ohmic state at which the voltage at its two terminals breaks down to very low values. As soon as the current flowing through the diac fails to reach a certain limit value (holding current), the diac returns to its high ohmic initial state.

Figure 2:
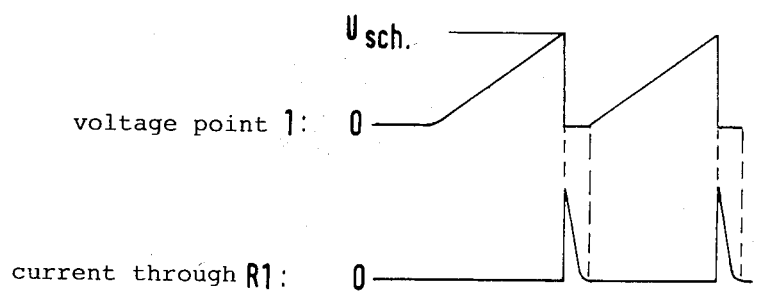
FIG. 2 is a time diagram of the voltage course at point 1 in FIG. 1 and of the current course through the precision resistor.

In FIG. 2 the respective voltage relationships at measuring point 1 of FIG. 1 as well as the course of the current through the precision resistor R1 are shown diagrammatically as a function of time. If the voltage at the main conductor R rises (in sine shape), starting from a value of zero, at first there will be no voltage drop across precision resistor R1 nor a voltage change at capacitor $C_B$ because no current will flow and all the voltage at the diac drops because of the high resistance of the diac (test pulse generator TG). The voltage at measuring point 1 and at the diac rises accordingly in parallel with the voltage of the main conductor R, as shown in the upper curve of FIG. 2. As the voltage at the diac (TG) reaches the preselected threshold value $U_{Sch}$ the diac switches into its low ohmic state and the voltage across the diac breaks down, apart from a minor residual voltage $U_{RE}$. At the instant after firing of the diac, the precision resistor R1 is passed by a current of the magnitude $(U_{Sch} - U_{RE}):R1$ which is illustrated in the lower curve in FIG. 2. Recharging of the capacitor $C_B$ is effected by this current having the time constant $R1 \times C_B$, the current intensity dropping exponentially, as shown at the bottom in FIG. 2, until the holding current of the diac is failed to be reached, whereupon the diac returns into its high ohmic state. Following that, the cycle begins again and the voltage at measuring point 1 rises with the voltage at the main conductor R until the crest value of the halfwave of the sinusoidal mains voltage is reached. The capacitor $C_B$ then will have been charged to a voltage which lies between the full peak voltage of the mains halfwave and the value which is diminished by the threshold voltage $U_{Sch}$.

Upon surpassing of the crest value, the same process is repeated at inverse polarity until the crest value of the negative halfwave has been reached, etc. The integral $\int i\,(t) \times dt$ of the pulses corresponds to the value which would have been reached if the capacitor C had been connected to the ground terminal M without the interposition of the diac (TG). In this way it is safeguarded that a hazard of persons suffering an electric shock cannot be given when use is made of a capacitor which is protective as described.

If a ground resistance $R_E$ of finite magnitude exists between the diac and the local reference ground M, the voltage amplitude of the test pulses $U_T = U_{Sch} - U_{RE}$ splits up between precision resistor R1 and grounding resistance $R_E$, as explained above, and the time constant at which the current amplitude of the pulses drops, grows in accordance with the value $C_B \times (R1 + R_E)$, whereas the integral $\int i\,(t) \times dt$ remains unchanged. The meter G monitoring the voltage drops across the precision resistor R1 and releasing an alarm when a limit value is failed to be reached, may be fed with voltage also directly from the mains connection without connecting a transformer in between.

With the circuit shown in FIG. 1 it is assumed that the only conductive connection between the protecting conductor S and the main conductor R or the neutral conductor N is established by way of the "true earth", i.e. the grounding of the protective conductor S at the place of the appliance and the grounding of the neutral conductor at a different place within the supply network of the power supply company.

Figure 3:
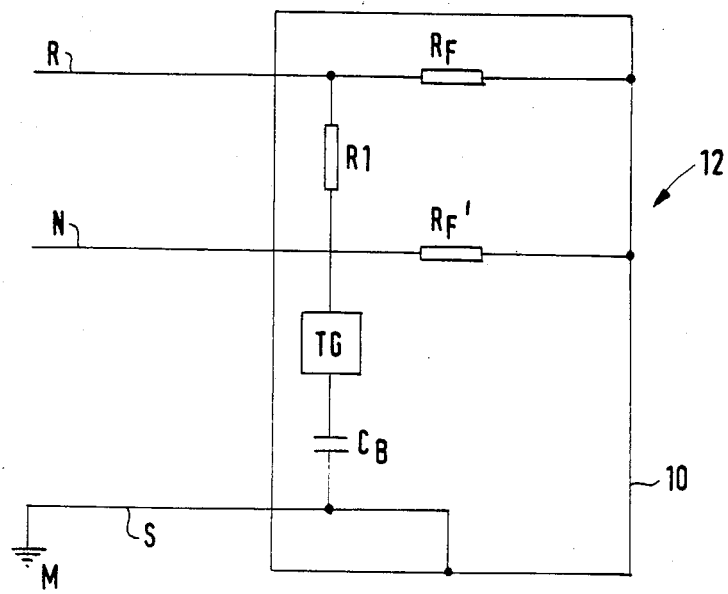
FIG. 3 shows possible insulation faults in an electrical appliance.

In accordance with FIG. 3 it is conceivable that an insulation fault resistor $R_F$ for instance connects the main conductor R with the casing 10 of the appliance 12 or that an insulation fault resistor $R_{F'}$ connects the neutral conductor N in that manner. Such a finite insulation fault resistor $R_F$ or $R_{F'}$ would be connected parallel to the circuit R1, TG, and $C_B$ between the main conductor R or the neutral conductor N, respectively, and the protecting conductor S. It is conceivable that the grounding resistance $R_E$ becomes infinitely great and the insulation fault resistor $R_F$ or $R_{F'}$ approaches zero as a shortcircuit. In this event the protective circuit would provide erroneous results in that it would indicate perfect protective grounding.

Figure 4:
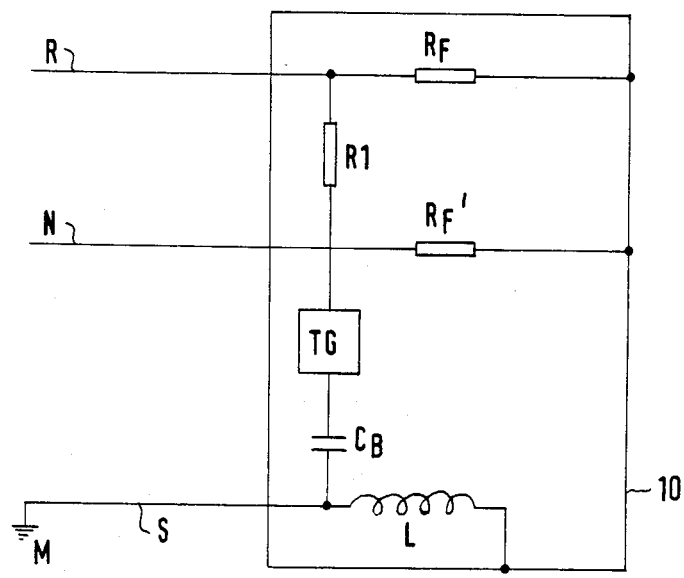
FIG. 4 shows a preferred modification of the invention.

To avoid such an erroneous indication, a protecting conductor choke L is connected between the input of the protecting conductor S to which the capacitor $C_B$ is connected directly and the casing 10 of the appliance, as shown in FIG. 4. The impedance of this choke is small for the mains frequency (50–60 Hz) so that it does not present any considerable voltage drop for a shunted current. However, for the short pulses of the test pulse generator TG the impedance of this protecting conductor choke L which is connected in series with the insulation fault resistor $R_F$ or $R_{F'}$ is so high that the ground resistance $R_E$ practically can be measured truthfully.

What is claimed is:

1. A circuit for the continuous watching of the grounding resistance of an electrical appliance having a casing, a protecting conductor and a live lead, the electrically conductive parts of which that may be touched, including the casing of the appliance being connected to a ground potential by said protecting conductor, comprising a series connection connecting said live lead to said protecting conductor and including at least one precision resistor for measuring purposes, one test pulse generator providing pulses with a pulse rise time, and one capacitor connected to said precision resistor providing a time constant greater than said pulse rise time.

2. The circuit as claimed in claim 1 wherein the test pulse generator delivers voltage pulses of constant amplitude.

3. The circuit as claimed in claim 2 wherein the duration of the pulses generated by the test pulse generator, the precision resistor, and the capacitance of the capacitor are so dimensioned that the time constant of the RC member composed of the precision resistor and the capacitor is great as compared to the pulse rise time.

4. The circuit as claimed in claim 3 wherein the voltage drop across the precision resistor is measured by a voltmeter and compared with a preselectable comparative voltage.

5. The circuit as claimed in claim 4 wherein the feeding of voltage to the electrical appliance or part thereof is interrupted when the voltage drop measured by the voltmeter drops below the comparative voltage.

6. The circuit as claimed in claim 5 wherein a warning means is released when the voltage drop measured by the voltmeter drops below the comparative voltage.

7. The circuit as claimed in claim 6 wherein the capacitor is designed to afford protection against electric shock.

8. The circuit as claimed in claim 7 wherein the capacitor allows for the leakage current caused upon touching by the mains voltage as well as the pulse current caused by the test pulse generator remain smaller than the limit value admissible for the human body even if the ground connection is interrupted between the electrically conductive parts and the ground potential.

9. The circuit as claimed in claim 8 wherein the amplitude of the voltage generated by the test pulse generator lies below the limit value admissible for human contact.

10. The circuit as claimed in claim 9 wherein the test pulse generator includes a trigger diode.

11. The circuit as claimed in claim 9 wherein the test pulse generator includes a transistor circuit which is high ohmic upon application of an external voltage below a certain threshold value and low ohmic upon application of an external voltage above the certain threshold value.

12. The circuit as claimed in claim 11 and further comprising a protecting conductor choke connected between the electrically conductive parts and the protecting conductor, the impedance of the choke being small at mains frequency but great for the test pulses.

13. A circuit for continuously monitoring the ground resistance of an electrical appliance having a casing, a protecting conductor and a live lead, the casing being connected to a ground potential by the protecting conductor, the circuit comprising:
   a precision resistor;
   a test pulse generator connected to said precision resistor and providing pulses with a pulse rise time;
   a capacitor connected to said precision resistor providing a time constant greater than the pulse rise time; and,
   the circuit being serially connected between the live lead and the protecting conductor.

14. The circuit of claim 13 wherein the pulses have a constant voltage amplitude.

15. The circuit of claim 14 wherein the parameters of said test pulse generator, said precision resistor, and said capacitor are such that the time constant of the RC member composed of said precision resistor and said capacitor is great compared to the pulse rise time.

16. The circuit of claim 15 wherein the voltage drop across said precision resistor is measured by a voltmeter and is compared with a preselectable comparative voltage and wherein voltage to the electrical appliance is interrupted when the voltage drop drops below the comparative voltage.

17. The circuit of claim 16 wherein a warning means for alerting a person is released when the voltage drop drops below the comparative voltage.

18. The circuit of claim 17 wherein said capacitor allows for the leakage current caused upon touching and supplied by the mains voltage and for the pulse current caused by said test pulse generator to remain smaller than the limit value admissible for the human body even if the ground connection is interrupted between the electrically conductive parts and the ground potential and wherein the amplitude of the voltage generated by said test pulse generator lies below the limit value admissible for human contact.

19. The circuit of claim 18 wherein said test pulse generator includes a trigger diode.

20. The circuit of claim 19 wherein said test pulse generator further includes a transistor circuit which is high ohmic upon application of an external voltage below a certain threshold value and low ohmic upon application of an external voltage above the certain threshold value.

21. The circuit of claim 20 further comprising a protecting conductor choke connected between the electrically conductive parts and the protecting conductor, the impedance of the choke being small at mains frequency but great for the test pulses.

* * * * *